(12) United States Patent
Chou et al.

(10) Patent No.: US 10,522,532 B2
(45) Date of Patent: Dec. 31, 2019

(54) THROUGH VIA EXTENDING THROUGH A GROUP III-V LAYER

(71) Applicant: Taiwan Semiconductor Manufacturing Co., Ltd., Hsin-Chu (TW)

(72) Inventors: Chung-Yen Chou, Hsinchu (TW); Chia-Shiung Tsai, Hsin-Chu (TW); Shih-Chang Liu, Alian Township (TW); Yung-Chang Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 645 days.

(21) Appl. No.: 15/216,830

(22) Filed: Jul. 22, 2016

(65) Prior Publication Data
US 2017/0345812 A1   Nov. 30, 2017

Related U.S. Application Data

(60) Provisional application No. 62/342,399, filed on May 27, 2016.

(51) Int. Cl.
*H01L 27/02* (2006.01)
*H01L 29/205* (2006.01)
(Continued)

(52) U.S. Cl.
CPC .... *H01L 27/0255* (2013.01); *H01L 21/76898* (2013.01); *H01L 21/8221* (2013.01);
(Continued)

(58) Field of Classification Search
CPC .......... H01L 27/0255; H01L 21/76898; H01L 21/8221; H01L 23/481; H01L 27/0605;
(Continued)

(56) References Cited

U.S. PATENT DOCUMENTS 6,431,689 B1 * 8/2002 Schippers ................ B41J 2/055
347/65
6,489,217 B1 * 12/2002 Kalnitsky ............... H01L 21/84
257/E21.703

(Continued)

OTHER PUBLICATIONS

Schimel, Paul. "Cascode Configured GaN Switch Enables Faster Switching Frequencies and Lower Losses." Electronic Design. May 14, 2012.

(Continued)

*Primary Examiner* — Charles D Garber
*Assistant Examiner* — S M Sohel Imtiaz
(74) *Attorney, Agent, or Firm* — Eschweiler & Potashnik, LLC

(57) ABSTRACT

A process for manufacturing an integrated circuit (IC) with a through via extending through a group III-V layer to a diode is provided. An etch is performed through the group III-V layer, into a semiconductor substrate underlying the group III-V layer, to form a via opening. A doped region is formed in the semiconductor substrate, through the via opening. Further, the doped region is formed with an opposite doping type as a surrounding region of the semiconductor substrate. The through via is formed in the via opening and in electrical communication with the doped region.

20 Claims, 7 Drawing Sheets

(51) Int. Cl.
*H01L 29/778* (2006.01)
*H01L 23/48* (2006.01)
*H01L 27/06* (2006.01)
*H01L 21/768* (2006.01)
*H01L 21/822* (2006.01)
*H01L 29/20* (2006.01)

(52) U.S. Cl.
CPC ........ *H01L 23/481* (2013.01); *H01L 27/0605* (2013.01); *H01L 27/0694* (2013.01); *H01L 29/205* (2013.01); *H01L 29/7787* (2013.01); *H01L 29/2003* (2013.01)

(58) Field of Classification Search
CPC ............. H01L 27/0694; H01L 29/2003; H01L 29/205; H01L 29/7787
See application file for complete search history.

(56) References Cited

U.S. PATENT DOCUMENTS

| | | | | |
|---|---|---|---|---|
| 8,981,380 B2* | 3/2015 | Briere | ................. | H01L 21/8258 257/194 |
| 2005/0121686 A1* | 6/2005 | Keller | ................... | H01L 25/167 257/99 |
| 2006/0281309 A1* | 12/2006 | Trezza | ................. | H01L 21/6835 438/675 |
| 2009/0205852 A1* | 8/2009 | Chen | ..................... | H05K 3/428 174/254 |
| 2011/0018013 A1* | 1/2011 | Margalith | ............. | H01L 27/153 257/91 |
| 2012/0104497 A1* | 5/2012 | Denison | .............. | H01L 27/1203 257/348 |
| 2013/0020589 A1* | 1/2013 | Yu | ....................... | H01L 33/0079 257/88 |
| 2013/0020598 A1* | 1/2013 | Yang | .................... | H01L 25/167 257/98 |
| 2013/0032814 A1* | 2/2013 | Bour | .................. | H01L 21/0254 257/76 |
| 2013/0049203 A1* | 2/2013 | Ahrens | .................... | H01L 29/41 257/770 |
| 2013/0168750 A1* | 7/2013 | Ikhlef | ............... | H01L 27/14663 257/292 |
| 2013/0168796 A1* | 7/2013 | Ikhlef | ............... | H01L 27/14636 257/448 |
| 2013/0234207 A1* | 9/2013 | Choi | ..................... | H01L 29/778 257/194 |
| 2013/0256699 A1* | 10/2013 | Vielemeyer | ........... | H01L 29/778 257/77 |
| 2013/0264720 A1* | 10/2013 | Chun | ................... | H01L 23/481 257/774 |
| 2014/0035114 A1* | 2/2014 | Gogoi | .................. | H01L 23/142 257/676 |
| 2014/0077374 A1* | 3/2014 | Lin | ...................... | H01L 23/528 257/741 |
| 2014/0117415 A1* | 5/2014 | Ma | ...................... | H01L 27/0617 257/262 |
| 2014/0131806 A1* | 5/2014 | Zhu | ................. | H01L 21/823456 257/368 |
| 2014/0191249 A1* | 7/2014 | Blanchard | ............ | H01L 27/153 257/77 |
| 2014/0210058 A1* | 7/2014 | Lee | ...................... | H01L 23/481 257/657 |
| 2015/0102406 A1* | 4/2015 | Lee | .................... | H01L 29/7816 257/343 |
| 2015/0349064 A1* | 12/2015 | Azize | ................. | H01L 29/2003 257/76 |
| 2015/0357466 A1* | 12/2015 | Kumar | ............... | H01L 29/7817 257/341 |
| 2016/0064538 A1* | 3/2016 | Nakayama | .......... | H01L 29/7783 257/20 |
| 2016/0196972 A1* | 7/2016 | Basu | ................ | H01L 21/02505 257/506 |

OTHER PUBLICATIONS

Roberts, et al. "GaN Transistors—Drive Control, Thermal Management, and Isolation." Power Electronics. Feb. 19, 2013.

\* cited by examiner

US 10,522,532 B2

THROUGH VIA EXTENDING THROUGH A GROUP III-V LAYER

REFERENCE TO RELATED APPLICATION

This application claims the benefit of U.S. Provisional Application No. 62/342,399, filed on May 27, 2016, the contents of which are incorporated herein by reference in their entirety.

BACKGROUND

Semiconductor devices based on silicon have been the standard for the past few decades. However, semiconductor devices based on alternative materials are receiving increasing attention for advantages over silicon-based semiconductor devices. For example, semiconductor devices based on group III-V semiconductor materials have been receiving increased attention due to high electron mobility and wide band gaps compared to silicon-based semiconductor devices. Such high electron mobility and wide band gaps allow improved performance and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
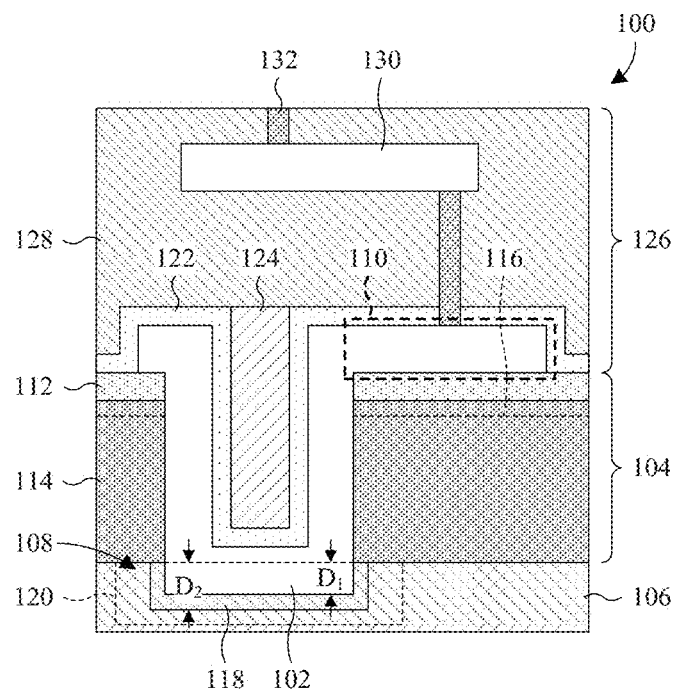
FIG. 1 illustrates a cross-sectional view of some embodiments of an integrated circuit (IC) with a through via extending through a group III-V layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) may comprise a bulk silicon substrate over which a gallium nitride (GaN) heterostructure is arranged. The GaN heterostructure comprises a GaN layer and an aluminum gallium nitride (AlGaN) layer. The AlGaN layer is arranged over and contacts the GaN layer to define a heterojunction and a two-dimensional electron gas (2-DEG). Further, the IC may comprise a high-electron-mobility transistor (HEMT) arranged over the 2-DEG.

The HEMT is susceptible to damage from transient voltages exceeding gate-source limits of the HEMT. Such transient voltages may, for example, be due to electrostatic discharge (ESD). Accordingly, a protection diode may be electrically coupled between a gate of the HEMT and a source of the HEMT to suppress the transient voltages and to keep the HEMT within the gate-source limits. However, due to process limitations, the protection diode is not integrated with the IC. Instead, the protection diode is electrically coupled to the HEMT during packaging. This, in turn, increases costs and the complexity of packaging the IC.

As an example of the process limitations, suppose arsenic is implanted into an upper surface of the bulk silicon substrate to define an n-type doped region of the protection diode. Further, suppose the GaN heterostructure and the HEMT are subsequently formed over the bulk silicon substrate. To electrically couple the HEMT to the protection diode, a through GaN via (TGV) is formed extending through the GaN heterostructure to the n-type doped region.

Forming the TGV may comprise performing an etch to the n-type doped region, through the GaN heterostructure. However, GaN is challenging to etch through and there is low selectivity between GaN and silicon. Accordingly, whereas the etch would ideally stop on or within the n-type doped region, the etch would extend through the n-type doped region to a location below the n-type doped region. For example, arsenic may be implanted to a maximum depth of 0.5 micrometers, whereas the etch may extend to a depth of about 1 micrometer. This, in turn, leads to leakage and renders the protection diode unsuitable for its intended purpose.

In view of the foregoing, the present application is directed towards a process for manufacturing a through via to facilitate the integration of a group III-V semiconductor device with an underlying diode. In some embodiments, an etch is performed into a semiconductor substrate, through a group III-V layer overlying the semiconductor substrate, to form a via opening. A doped region is formed in the semiconductor substrate, through the via opening, and with an opposite doping type as a surrounding region of the semiconductor substrate. The through via is formed in the via opening and in electrical communication with the doped region. The present application is also directed towards an IC with the through via.

Advantageously, by forming the doped region through the via opening, the doped region may extend into the semiconductor substrate to depth greater than the via opening. As such, the doped region may isolate or separate the through via from the surrounding region of the semiconductor substrate to reduce leakage. Further, the diode may be integrated into the IC for low cost and low packaging complexity.

With reference to FIG. 1, a cross sectional view 100 of some embodiments of an IC with a through via 102 is provided. As illustrated, the through via 102 extends through a group III-V heterostructure 104, into a semiconductor substrate 106 underlying the group III-V heterostructure 104. The semiconductor substrate 106 may be, for example, a bulk substrate of monocrystalline silicon or some other semiconductor substrate. The through via 102 extends into the semiconductor substrate 106 to a depth $D_1$ and terminates within a diode 108 of the semiconductor substrate 106. In some embodiments, the through via 102 conformally lines a via opening through which the through via 102 extends to the diode 108 and/or overlaps with the group III-V heterostructure 104 to define a pad region 110.

The group III-V heterostructure 104 comprises a barrier layer 112 and a channel layer 114. The barrier layer 112 is arranged over and contacts the channel layer 114, and further has a band gap unequal to that of the channel layer 114, such that a heterojunction is arranged at an interface with the channel layer 114. In some embodiments, the barrier layer 112 is a group III nitride or some other group III-V material. For example, the barrier layer 112 may be $Al_xG_{1-x}N$, where x is between 0 and 1. Further, in some embodiments, the barrier layer 112 is undoped. The channel layer 114 accommodates a 2-DEG 116 to which or from which the barrier layer 112 transfers electrons. In some embodiments, the channel layer 114 is a group III-V material and/or is undoped. For example, the channel layer 114 may be undoped GaN.

The diode 108 is arranged in the semiconductor substrate 106 and may be, for example, a Zener diode or a transient-voltage-suppression (TVS) diode. The diode 108 comprises a first doped region 118 and a second doped region 120. The first doped region 118 has a first doping type and extends into the semiconductor substrate 106 to a depth $D_2$. The depth $D_2$ of the first doped region 118 is greater than the depth $D_1$ of the through via 102 and, in some embodiments, is spaced over a lower or bottom surface of the semiconductor substrate 106. Further, the first doped region 118 isolates or separates the through via 102 from the second doped region 120. In some embodiments, the first doped region 118 is arranged along an upper or top surface of the semiconductor substrate 106, and/or laterally surrounds and directly underlies the through via 102 with, for example, a U-shaped cross-sectional profile.

The second doped region 120 is arranged along the first doped region 118 and has a second doping type opposite the first doping type. The first and second doping types may be, for example, respectively n-type and p-type, or vice versa. In some embodiments, the second doped region 120 is arranged along the upper or top surface of the semiconductor substrate 106 and/or along sides of the first doped region 118. Further, in some embodiments, the second doped region 120 is arranged directly under the first doped region 118 and/or contacts the first doped region 118. The second doped region 120 may be, for example, a bulk of the semiconductor substrate 106 or a well region of the semiconductor substrate 106.

In some embodiments, a passivation layer 122 is arranged over and lines the through via 102 and/or a dielectric filler layer 124 partially covers the through via 102. The passivation layer 122 may, for example, have a thickness of about 750-850 angstroms, such as about 800 angstroms, and/or may be or otherwise include, for example, silicon dioxide, silicon nitride or some other dielectric. The dielectric filler layer 124 fills the via opening through which the through via 102 extends and is arranged over the through via 102 and, in some embodiments, the passivation layer 122. The dielectric filler layer 124 may be or otherwise include, for example, silicon dioxide or some other dielectric.

Further, in some embodiments, a back-end-of-line (BEOL) interconnect structure 126 covers the through via 102 and the group III-V heterostructure 104. The BEOL interconnect structure 126 comprises an interlayer dielectric (ILD) layer 128 within which first interconnect layers 130 of line or pad features and second interconnect layers 132 of via features are alternatingly stacked. The ILD layer 128 may be, for example, silicon dioxide, silicon nitride, a low κ dielectric, some other dielectric, or a combination of the foregoing. As used herein, a low-κ dielectric is a dielectric with a dielectric constant κ less than about 3.9.

The first interconnect layers 130 electrically couple the second interconnect layers 132 together, and the second interconnect layers 132 electrically couple the first interconnect layers 130 together. For example, each neighboring pair of first interconnect layers may be electrically coupled by a second interconnect layer arranged therebetween, and/or each neighboring pair of second interconnect layers may be electrically coupled by a first interconnect layer arranged therebetween. Further, a bottom one of the first interconnect layers 130 is electrically coupled to the through via 102 by a bottom one of the second interconnect layers 132. For example, a bottom line or pad feature may be electrically coupled to the pad region 110 of the through via 102 by a bottom via feature. The first and second interconnect layers 130, 132 may be, for example, copper, aluminum copper, aluminum, tungsten, some other conductive material, or a combination of the foregoing.

While the through via 102 is illustrated and described as extending through the group III-V heterostructure 104, the through via 102 more generally extends through a group III-V layer, such as, for example, the channel layer 114 and/or the barrier layer 112. Therefore, in other embodiments, the through via 102 may extend through a group III-V layer, but not through a group III-V heterostructure. For example, the through via 102 may extend through a GaN layer, but not through a group III-V heterostructure.

Figure 2A:
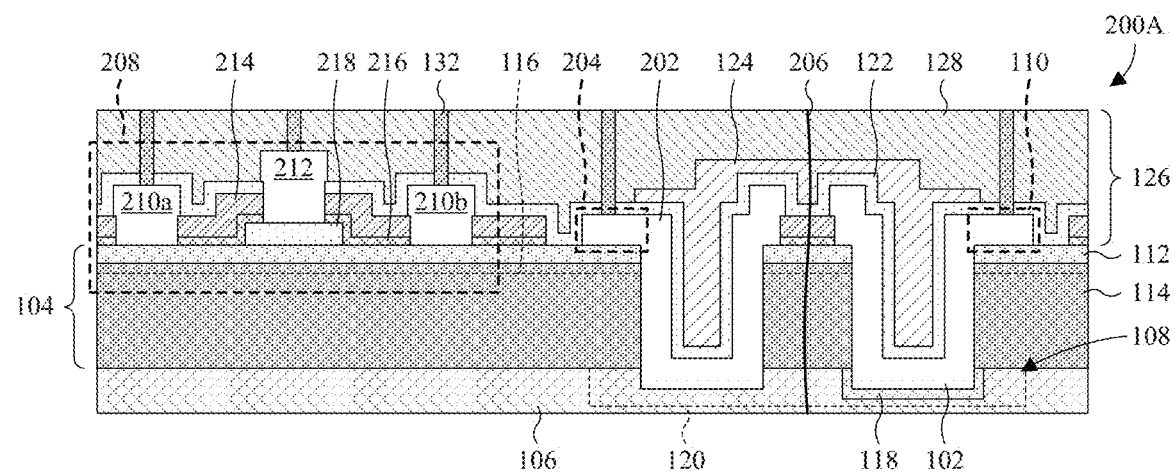
FIG. 2A illustrates a cross-sectional view of some more detailed embodiments of the IC of FIG. 1.

With reference to FIG. 2A, a cross sectional view 200A of some more detailed embodiments of the IC of FIG. 1 is provided. As illustrated, a second through via 202 extends through the group III-V heterostructure 104 into the second doped region 120 of the diode 108, laterally spaced from the first doped region 118 of the diode 108. In some embodiments, the second through via 202 overlaps with the group III-V heterostructure 104 to define a second pad region 204 and/or has the same configuration as the through via 102. Further, in some embodiments, the second through via 202 is employed to ground the bulk of the semiconductor substrate 106 and/or the second doped region 120. For ease of illustration, a curved line 206 between the through via 102 and the second through via 202 may, for example, represent intermediate structure that is not shown.

A HEMT 208 is arranged on the group III-V heterostructure 104, laterally offset from the through via 102 and the second through via 202. The HEMT 208 comprises a pair of source/drain electrodes 210a, 210b and a gate electrode 212. The source/drain electrodes 210a, 210b are respectively arranged on opposite sides of the gate electrode 212 and extend through a first passivation layer 214 to the barrier layer 112. In some embodiments, the source/drain electrodes 210a, 210b also extend through a gate protection layer 216 underlying the first passivation layer 214, and/or overlap the first passivation layer 214. The first passivation layer 214 may, for example, have a thickness of about 1500-2500 angstroms, such as about 2000 angstroms, and/or may be or otherwise include, for example, silicon dioxide, silicon nitride, some other dielectric layer, or a combination of the foregoing. The gate protection layer 216 may, for example, have a thickness of about 10-20 angstroms, such as about 15 angstroms, and/or may be or otherwise include, for example, aluminum nitride, aluminum oxide, or a material resistive to ammonium hydroxide.

The gate electrode 212 extends through the first passivation layer 214 and a second passivation layer 122 that covers the source/drain electrodes 210a, 210b and the first passivation layer 214. In some embodiments, the second passivation layer 122 lines the through via 102 and the second through via 202. Further, in some embodiments, the gate electrode 212 extends through or into the gate protection layer 216 and/or overlaps the second passivation layer 122. For example, the gate electrode 212 may extend into the gate protection layer 216 and terminate at a location spaced above a lower or bottom surface of the gate protection layer 216. The second passivation layer 122 may, for example, have a thickness of about 750-850 angstroms, such as about 800 angstroms, and/or may be or otherwise include, for example, silicon dioxide, silicon nitride, some other dielectric, or a combination of the foregoing.

In some embodiments, a group III-V gate layer 218 overlies the group III-V heterostructure 104, between the group III-V heterostructure 104 and the gate electrode 212. The group III-V gate layer 218 is arranged laterally between the source/drain electrodes 210a, 210b and, in some embodiments, is laterally spaced from the source/drain electrodes 210a, 210b. Further, the group III-V gate layer 218 is doped with n-type and/or p-type dopants, and/or may be, for example, the same material as the channel layer 114 or some other group III-V material. In some embodiments, the group III-V gate layer 218 is n-type or p-type GaN, or is a film comprising multiple layers alternating between n-type GaN and p-type GaN.

The BEOL interconnect structure 126 covers the through via 102, the second through via 202, and the HEMT 208. In some embodiments, the BEOL interconnect structure 126 electrically couples the gate electrode 212 to the second through via 202, and/or electrically couples the through via 102 to a source one of the source/drain electrodes 210a, 210b. Such electrical coupling may, for example, protect the HEMT 208 from transient voltages that may otherwise exceed gate-source limits of the HEMT 208 and damage the HEMT 208. Such transient voltages may, for example, be due to ESD.

Figure 2B:
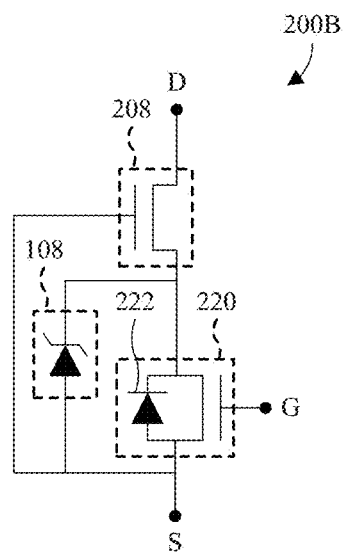
FIG. 2B illustrates a circuit diagram of some more detailed embodiments of the IC of FIG. 1.

With reference to FIG. 2B, a circuit diagram 200B illustrates some more detailed embodiments of the IC of FIG. 1 is provided. As illustrated, the HEMT 208 is electrically coupled in series with an insulated-gate field-effect transistor (IGFET) 220 according to a cascode-based configuration. The gate of the HEMT 208 is electrically coupled to a first source/drain of the IGFET 220, as well as to a protection diode 108 electrically coupled between the gate and a second source/drain of the IGFET 220. The IGFET 220 may be, for example, a metal-oxide-semiconductor field-effect transistor (MOSFET), and/or may comprise, for example, an intrinsic body diode 222 electrically coupled between the first and second source/drains of the IGFET 220. The protection diode 108 limits the voltage across the IGFET 220 to, for example, 10 volts.

In some embodiments, the HEMT 208 is in depletion mode and the IGFET 220 is an n-type MOSFET in enhancement mode, such that the HEMT 208 and the IGFET 220 are respectively normally on and normally off. The source of the HEMT 208 is electrically coupled to the drain of the IGFET 220, and the gate of the HEMT 208 is electrically coupled to the source of the IGFET 220, such that the gate-source voltage of the HEMT 208 is the negative of the drain-source voltage of the IGFET 220. Further, the protection diode 108 is electrically coupled between the gate of the HEMT 208 and the source of the HEMT 208, as well as between the drain of the IGFET 220 and the source of the IGFET 220, to protect the HEMT 208 from transient voltages that may exceed gate-source limits of the HEMT 208. In operation, when the IGFET 220 turns off, the voltage across the IGFET 220 rises to turn off the HEMT 208 and the protection diode 108 clamps or limits the voltage. For example, the voltage may rise towards 10 volts and the protection diode 108 may clamp or limit the voltage to 10 volts to advantageously protect the HEMT 208 from damage. Further, when the IGFET 220 turns on, the voltage across the IGFET 220 drops to turn on the HEMT 208. For example, the voltage may drop to 0 volts.

While not shown, in some embodiments, the electrical coupling described above may be performed by the through via 102 of FIG. 2A, the second through via 202 of FIG. 2A, and the BEOL interconnect structure 126 of FIG. 2A. Further, in some embodiments, the IGFET 220 may be arranged on the semiconductor substrate 106 of FIG. 2A, under the group III-V heterostructure 104, or may be arranged over the group III-V heterostructure 104 in an epitaxial layer, such as a monocrystalline silicon layer, overlying the group III-V heterostructure 104. As to the former, through vias may electrically couple to the IGFET 220. Even more, in other embodiments, the through via 102 and the second through via 202 extend through a group III-V layer, but not through a group III-V heterostructure. In such other embodiments, the group III-V heterostructure 104 of FIG. 2A may be replaced by a group III-V layer, such as, for a GaN layer, without a group III-V heterostructure.

With reference to FIGS. 3-15, a series of cross-sectional views 300-1500 of some embodiments of a method for manufacturing an IC with a through via extending through a group III-V layer is provided. The IC may, for example, be as described in FIG. 2A.

Figure 3:
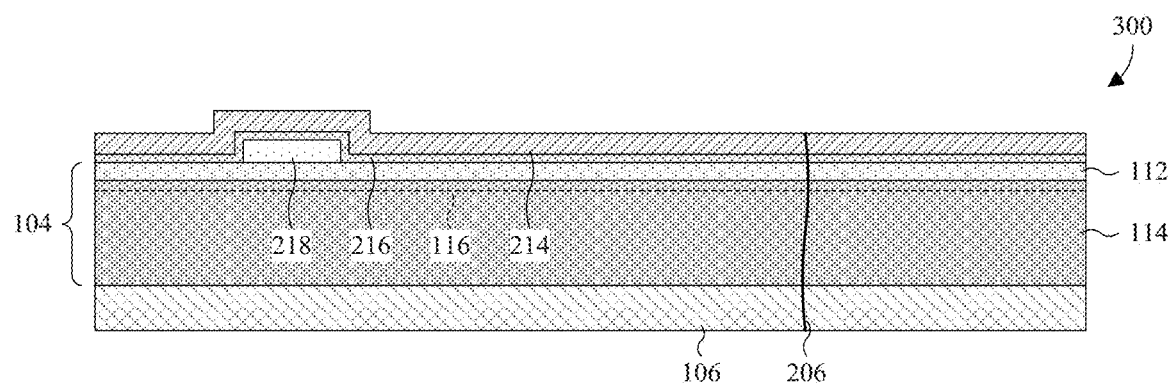
FIGS. 3-15 illustrate a series of cross-sectional views of some embodiments of a method for manufacturing an IC with a through via extending through a group III-V layer.

As illustrated by the cross-sectional view 300 of FIG. 3, a first passivation layer 214 is formed covering a group III-V heterostructure 104 that overlies a semiconductor substrate 106. The group III-V heterostructure 104 comprises a barrier layer 112 and a channel layer 114 stacked to define a heterojunction along which a 2-DEG 116 is arranged. Further, in some embodiments, the first passivation layer 214 is formed conformally and/or is formed of silicon dioxide or some other oxide. For ease of illustration, a curved line 206 may, for example, represent additional structure that is not shown.

The process for forming the first passivation layer 214 may comprise, for example, depositing or growing the first passivation layer 214. For example, the first passivation layer 214 may be deposited or grown by thermal oxidation, vapor deposition, sputtering, or a combination of the foregoing. As used herein, vapor deposition may be, for example, chemical vapor deposition (CVD) or physical vapor deposition (PVD).

In some embodiments, before forming the first passivation layer 214, a group III-V gate layer 218 is formed over the group III-V heterostructure 104. The group III-V gate layer 218 may, for example, be formed of a doped group III-V material, such as n-type or p-type GaN. Further, the process for forming the group III-V gate layer 218 may comprise, for example, depositing of growing the group III-V gate layer 218 over the group III-V heterostructure 104, and subsequently etching the group III-V gate layer 218 to limit the group III-V gate layer 218 to a gate region of the group III-V heterostructure 104. The etching may, for example, be performed selectively using photolithography.

Further, in some embodiments, before forming the first passivation layer 214, a gate protection layer 216 is formed over the group III-V heterostructure 104. The gate protection layer 216 may, for example, be formed conformally, and/or may, for example, be formed of aluminum oxide, aluminum nitride, or a combination of the foregoing. Further, the gate protection layer 216 may, for example, be formed covering the group III-V gate layer 218 to protect the group III-V gate layer 218 from subsequent processing. The process for forming the gate protection layer 216 may, for example, comprise depositing or growing the gate protection layer 216. For example, the gate protection layer 216 may be deposited or grown by vapor deposition, sputtering, or a combination of the foregoing.

Figure 4:
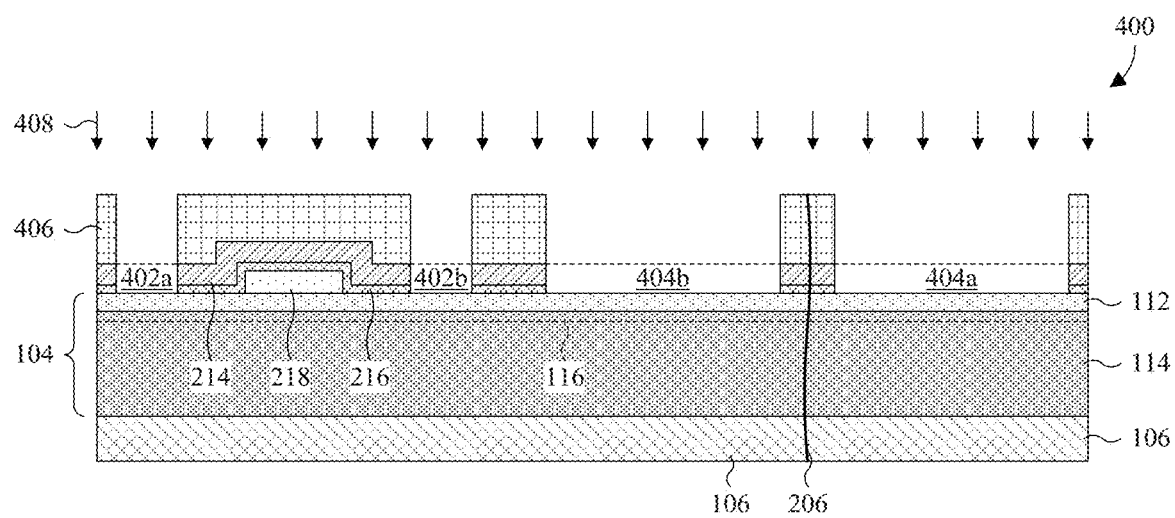

As illustrated by the cross-sectional view 400 of FIG. 4, a first etch is performed to the group III-V heterostructure 104, through the first passivation layer 214 and, in some embodiments, the gate protection layer 216, to form a pair of source/drain openings 402a, 402b. The source/drain openings 402a, 402b are formed laterally spaced and, in some embodiments, respectively on opposite sides of the group III-V gate layer 218. Further, in some embodiments, the first etch also forms pad openings 404a, 404b for through vias under manufacture.

The process for performing the first etch may comprise, for example, depositing or growing a first photoresist layer 406 over the first passivation layer 214. Further, the process may comprise, for example, patterning the first photoresist layer 406 using photolithography, such that the first photoresist layer 406 comprises a pattern of openings corresponding to the source/drain openings 402a, 402b and the pad openings 404a, 404b. With the first photoresist layer 406 patterned, the process may comprise, for example, applying one or more first etchants 408 to the first passivation layer 214 with the first photoresist layer 406 in place, and subsequently stripping the first photoresist layer 406.

Figure 5:
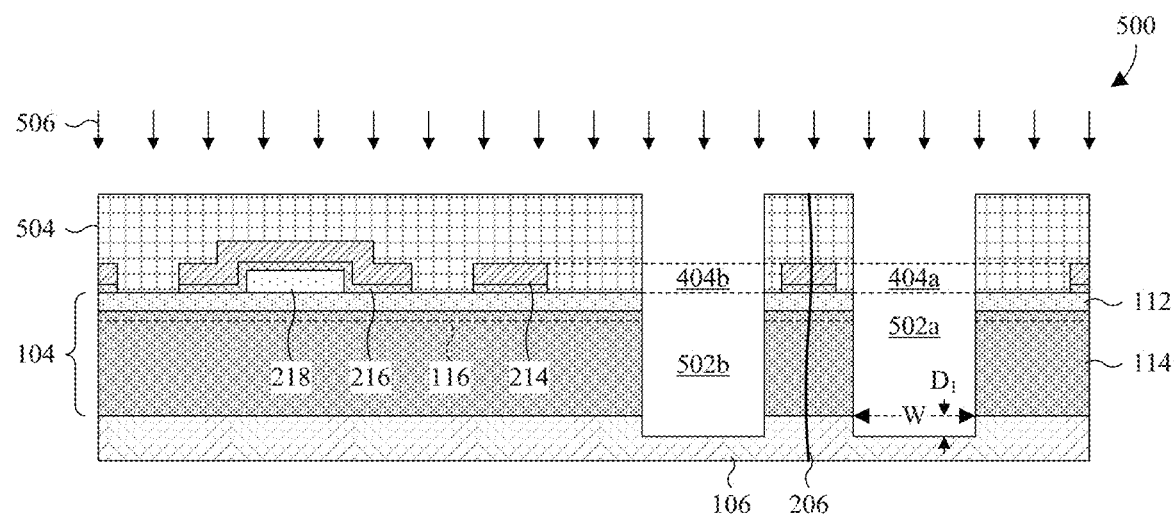

As illustrated by the cross-sectional view 500 of FIG. 5, a second etch is performed into the semiconductor substrate 106, through the pad openings 404a, 404b and the group III-V heterostructure 104, to form a pair of via openings 502a, 502b corresponding to the pad openings 404a, 404b. The via openings 502a, 502b are formed extending into the semiconductor substrate 106 to a depth $D_1$ and, in some embodiments, with lower or bottom surfaces spaced over a lower or bottom surface of the semiconductor substrate 106. Further, in some embodiments, the via openings 502a, 502b are formed with widths W that are less than those of the pad openings 404a, 404b. The widths W may, for example, be 5 micrometers.

The process for performing the second etch may comprise, for example, depositing or growing a second photoresist layer 504 over the first passivation layer 214, and filling the source/drain openings 402a, 402b and the pad openings 404a, 404b. Further, the process may comprise, for example, patterning the second photoresist layer 504 using photolithography, such that the second photoresist layer 504 partially fills the pad openings 404a, 404b and comprises a pattern of openings corresponding to the via openings 502a, 502b. With the second photoresist layer 504 patterned, the process may comprise, for example, applying one or more second etchants 506 to the group III-V heterostructure 104 with the second photoresist layer 504 in place, and subsequently stripping the second photoresist layer 504.

Figure 6:
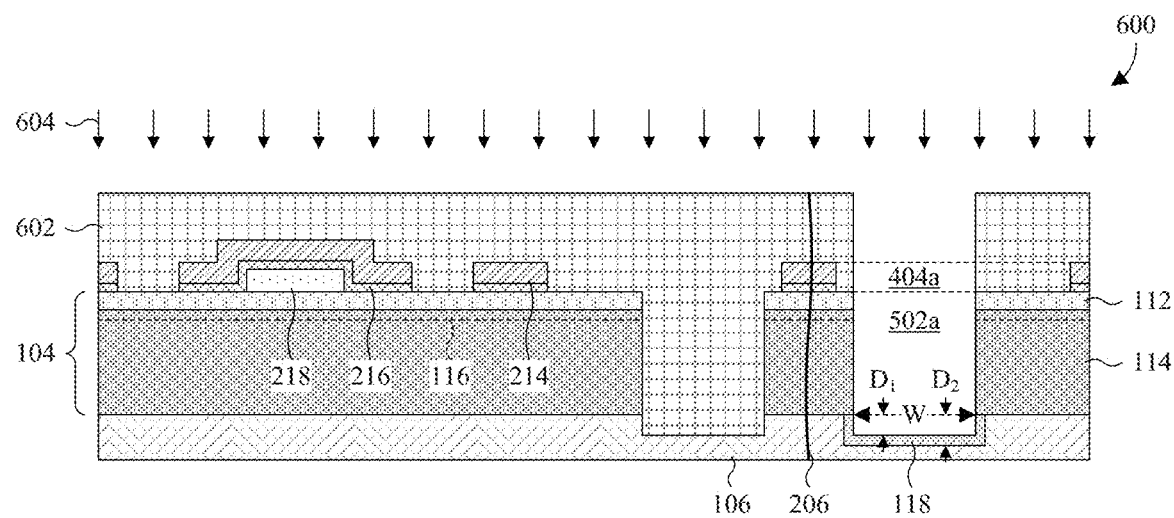

As illustrated by the cross-sectional view 600 of FIG. 6, a doped region 118 is formed in the semiconductor substrate 106, through a first via opening 502a of the via openings 502a, 502b. The doped region 118 is formed extending into the semiconductor substrate 106, from an upper or top surface of the semiconductor substrate 106, to a depth $D_2$ that is greater than the depth $D_1$ of the first via opening 502a. The depth $D_2$ of the doped region 118 may, for example, be greater than about 1 micrometer, such as about 1.5 or 2 micrometers. Further, the doped region 118 is formed along sidewalls of the first via opening 502a and a lower or bottom surface of the first via opening 502a. The doped region 118 may, for example, be cup shaped and/or have a U-shaped cross-sectional profile.

Advantageously, the doped region 118 isolates or separates the first via opening 502a from a bulk of the semiconductor substrate 106 or a well region (not shown) within which the doped region 118 is arranged. Such isolation or separation is enhanced by the depth $D_2$ of the doped region 118, which is greater than the depth $D_1$ of the first via opening 502a. This, in turn, reduces leakage current when the doped region 118 is part of a diode.

The process for forming the doped region 118 may comprise, for example, depositing or growing a third photoresist layer 602 over the first passivation layer 214, and filling the source/drain openings 402a, 402b, the pad openings 404a, 404b, and the via openings 502a, 502b. Further, the process may comprise, for example, patterning the third photoresist layer 602 using photolithography, such that the third photoresist layer 602 laterally surrounds the first via opening 502a. With the third photoresist layer 602 patterned, the process may comprise, for example, implanting dopants 604 into the semiconductor substrate 106, through the first via opening 502a and with the third photoresist layer 602 in place, and subsequently stripping the third photoresist layer 602. The dopants 604 may, for example, be arsenic and/or may, for example, be implanted by ion implantation.

Figure 7:
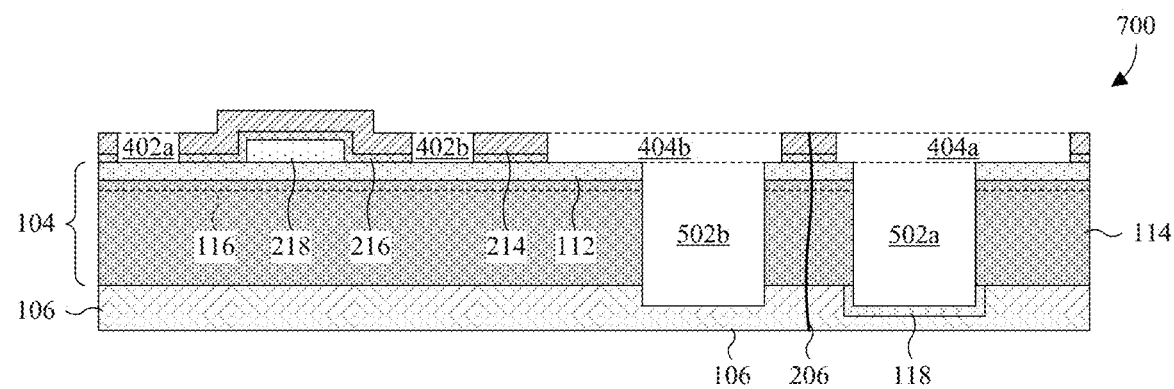

As illustrated by the cross-sectional view 700 of FIG. 7, the structure of FIG. 6 is annealed to activate dopants of the doped region 118. In the embodiments, the process for annealing the structure comprises heating an ambient environment of the structure to several hundred degrees Celsius using a furnace.

Figure 8:
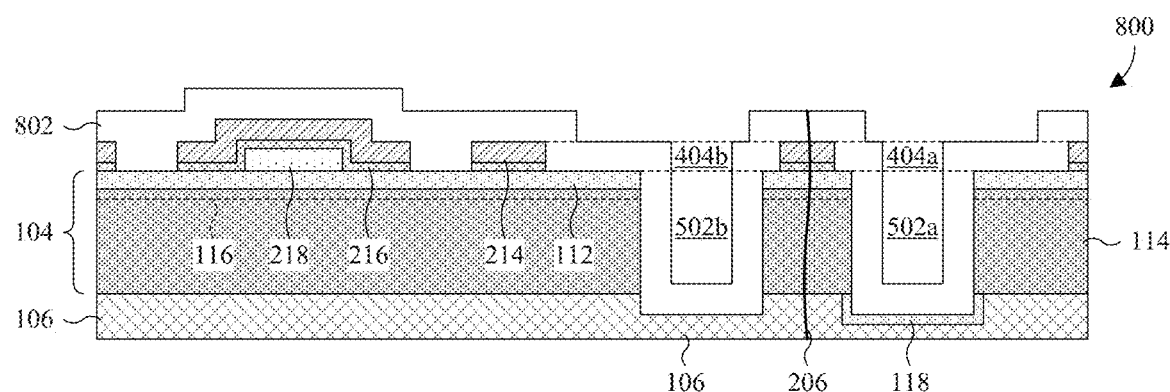

As illustrated by the cross-sectional view 800 of FIG. 8, a conductive layer 802 is formed over the first passivation layer 214, filling the source/drain openings 402a, 402b (see, e.g., FIG. 7), and lining the pad and via openings 404a, 404b, 502a, 502b. In some embodiments, the conductive layer 802 is formed conformally and/or of a metal. Further, in some embodiments, the process for forming the conductive layer 802 comprises depositing or growing the conductive layer 802. The conductive layer 802 may be deposited or grown by, for example, electro chemical plating (ECP), vapor deposition, or a combination of the foregoing.

Figure 9:
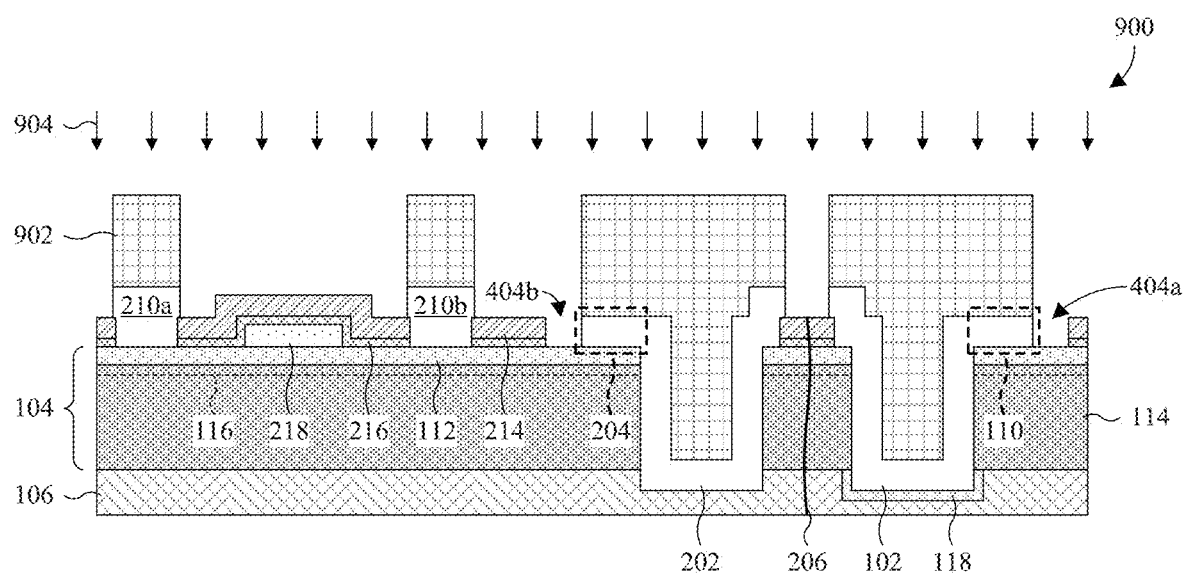

As illustrated by the cross-sectional view 900 of FIG. 9, a third etch is performed through the conductive layer 802 (see, e.g., FIG. 8) to form a pair of source/drain electrodes 210a, 210b respectively in the source/drain openings 402a, 402b (see, e.g., FIG. 7). Further, the third etch is performed to form a pair of through vias 102, 202 respectively in the via openings 502a, 502b (see, e.g., FIG. 8) and respectively in the pad openings 404a, 404b. In some embodiments, the third etch is performed, such that the through vias 102, 202 comprise respective pad regions 110, 204 in the pad openings 404a, 404b.

The process for performing the third etch may comprise, for example, depositing or growing a fourth photoresist layer 902 over the conductive layer 802. Further, the process may comprise, for example, patterning the fourth photoresist layer 902 using photolithography, such that the fourth photoresist layer 902 has a pattern corresponding to a layout of the source/drain electrodes 210a, 210b and the through vias 102, 202. With the fourth photoresist layer 902 patterned, the process may comprise, for example, applying one or more third etchants 904 to the conductive layer 802 with the fourth photoresist layer 902 in place, and subsequently stripping the fourth photoresist layer 902.

Figure 10:
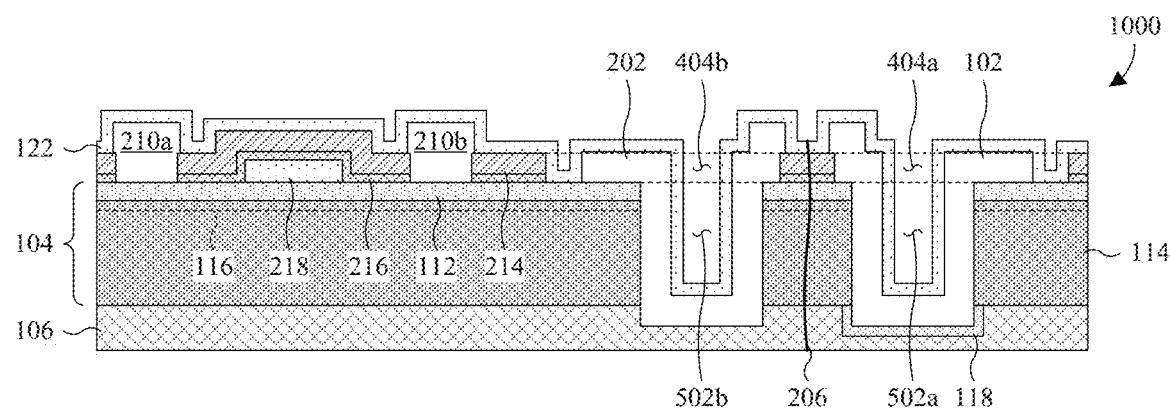

As illustrated by the cross-sectional view 1000 of FIG. 10, a second passivation layer 122 is formed covering the first passivation layer 214, as well as the source/drain electrodes 210a, 210b and the through vias 102, 202. In some embodiments, the second passivation layer 122 is formed conformally and/or is formed of silicon nitride or some other nitride. Further, in some embodiments, the process for forming the second passivation layer 122 comprises depositing or growing the second passivation layer 122 by, for example, vapor deposition, sputtering, or a combination of the foregoing.

Figure 11:
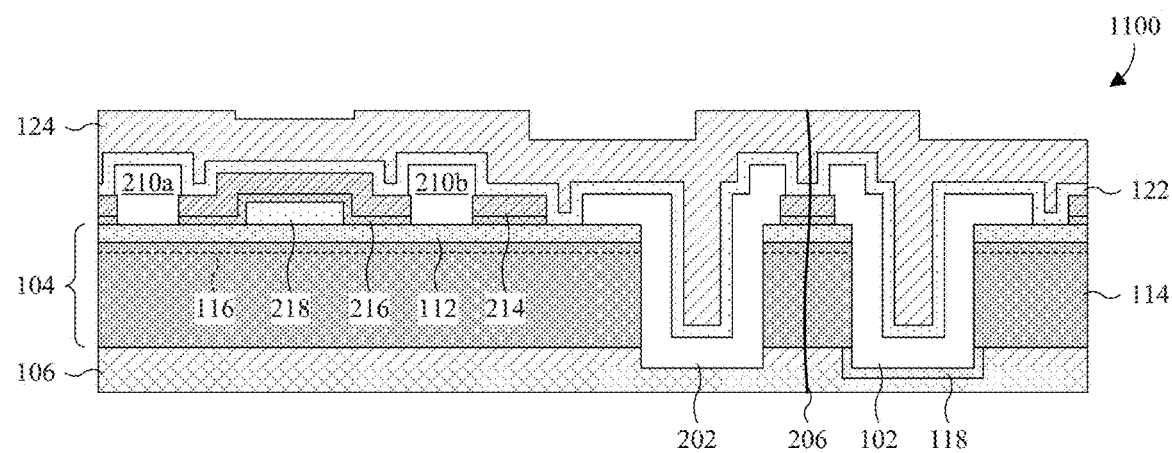

As illustrated by the cross-sectional view 1100 of FIG. 11, a dielectric filler layer 124 is formed covering the second passivation layer 122, as well as filling the via openings 502a, 502b (see, e.g., FIG. 10) and the pad openings 404a, 404b (see, e.g., FIG. 10). In some embodiments, the dielectric filler layer 124 is formed conformally and/or is formed of silicon dioxide or some other oxide. Further, in some embodiments, the dielectric filler layer is formed with a thickness of about 2-3 micrometers, such as about 2.5 micrometers. The process for forming the dielectric filler layer 124 may comprise, for example, depositing or growing the dielectric filler layer 124. For example, the dielectric filler layer 124 may be deposited or grown by thermal oxidation, vapor deposition, sputtering, or a combination of the foregoing.

Figure 12:
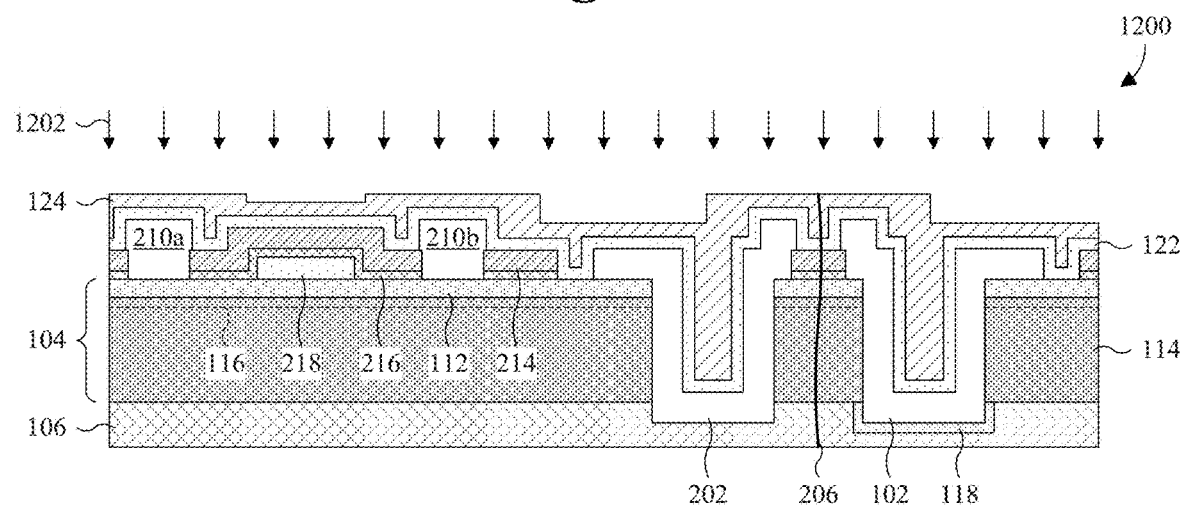

As illustrated by the cross-sectional view 1200 of FIG. 12, a fourth etch is performed into the dielectric filler layer 124 to etch back an upper or top surface of the dielectric filler layer 124 towards the group III-V heterostructure 104. In some embodiments, the upper or top surface of the dielectric filler layer 124 may be etched back by, for example, about 1.5-2.5 micrometers, such as about 2 micrometers. The process for performing the fourth etch may comprise, for example, applying one or more fourth etchants 1202 to the dielectric filler layer 124.

Figure 13:
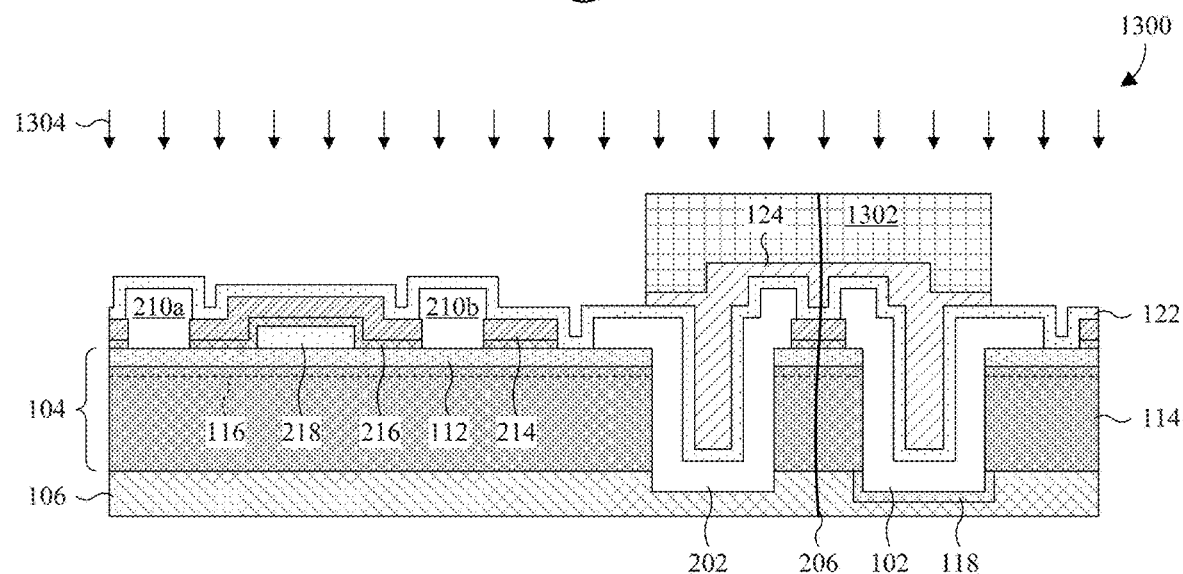

As illustrated by the cross-sectional view 1300 of FIG. 13, a fifth etch is performed through the dielectric filler layer 124 to localize the dielectric filler layer 124 to the through vias 102, 202. The process for performing the fifth etch may comprise, for example, depositing or growing a fifth photoresist layer 1302 over the dielectric filler layer 124. Further, the process may comprise, for example, patterning the fifth photoresist layer 1302 using photolithography, such that the fifth photoresist layer 1302 is localized over the through vias 102, 202. With the fifth photoresist layer 1302 patterned, the process may comprise, for example, applying one or more fifth etchants 1304 to the dielectric filler layer 124 with the fifth photoresist layer 1302 in place, and subsequently stripping the fifth photoresist layer 1302. The one or more fifth etchants 1304 may comprise, for example, a buffered oxide etchant (BOE) with high selectivity for the dielectric filler layer 124 relative to the second passivation layer 122.

Figure 14:
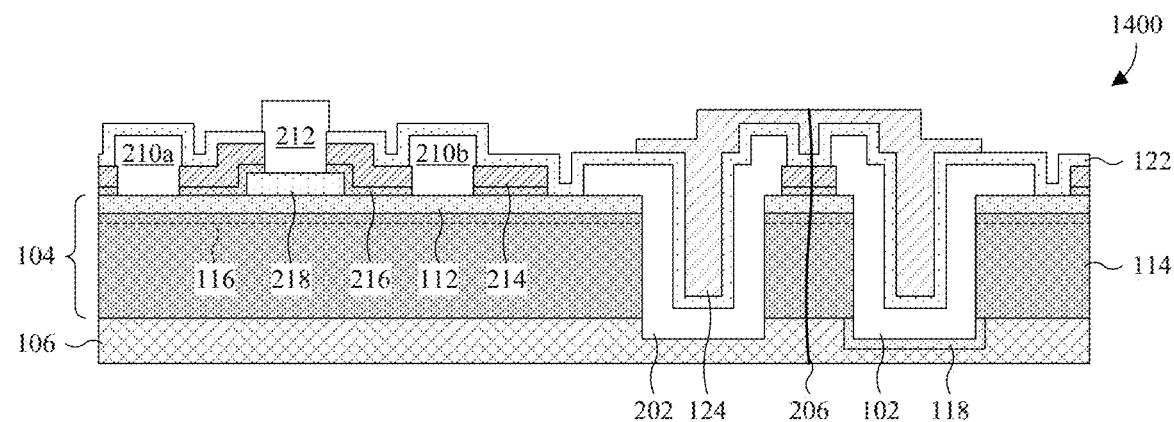

As illustrated by the cross-sectional view 1400 of FIG. 14, a gate electrode 212 is formed laterally between the source/drain electrodes 210a, 210b and extending through the first and second passivation layers 214, 122. In some embodiments, the gate electrode 212 is also formed extending through or into the gate protection layer 216, and/or is formed directly over the group III-V gate layer 218.

The process for forming the gate electrode 212 may comprise, for example, performing an initial etch through the first and second passivation layers 214, 122 to form a gate opening laterally between the source/drain electrodes 210a, 210b. The process may also comprise, for example, depositing a conductive layer filling the gate opening, and subsequently patterning the conductive layer into the gate electrode 212 with an additional etch. The initial and additional etches may be, for example, performed selectively using photolithography.

Figure 15:
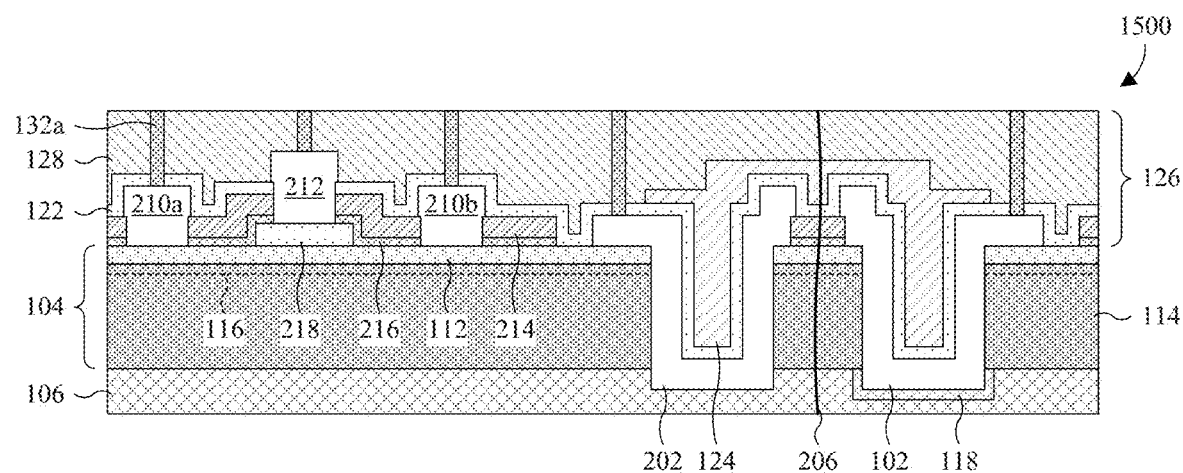

As illustrated by the cross-sectional view 1500 of FIG. 15, a BEOL interconnect structure 126 is formed over the structure of FIG. 14. The BEOL interconnect structure 126 is formed with an interconnect layer 132a of via features extending through an ILD layer 128 to the source/drain electrodes 210a, 210b, the gate electrode 212, the through vias 102, 202, or a combination of the foregoing. The interconnect layer 132a may, for example, be formed by a single-damascene-like process or a dual-damascene-like process. A single-damascene-like process and a dual-damascene-like process are respectively a single-damascene process and a dual-damascene process that are not restricted to copper.

While the embodiments of FIGS. 3-15 illustrate the doped region 118 as being formed through the first via opening 502a (see, e.g., FIG. 6), the doped region 118 may instead be formed through a second via opening 502b of the via openings 502a, 502b (see, e.g., FIG. 5) in other embodiments. Further, while the through vias 102, 202 are illustrated and described as extending through the group III-V heterostructure 104, the through vias 102, 202 more generally extend through a group III-V layer, such as, for example, the channel layer 114 and/or the barrier layer 112. Therefore, in other embodiments, the group III-V heterostructure 104 may be replaced by a group III-V layer without a group III-V heterostructure.

Figure 16:
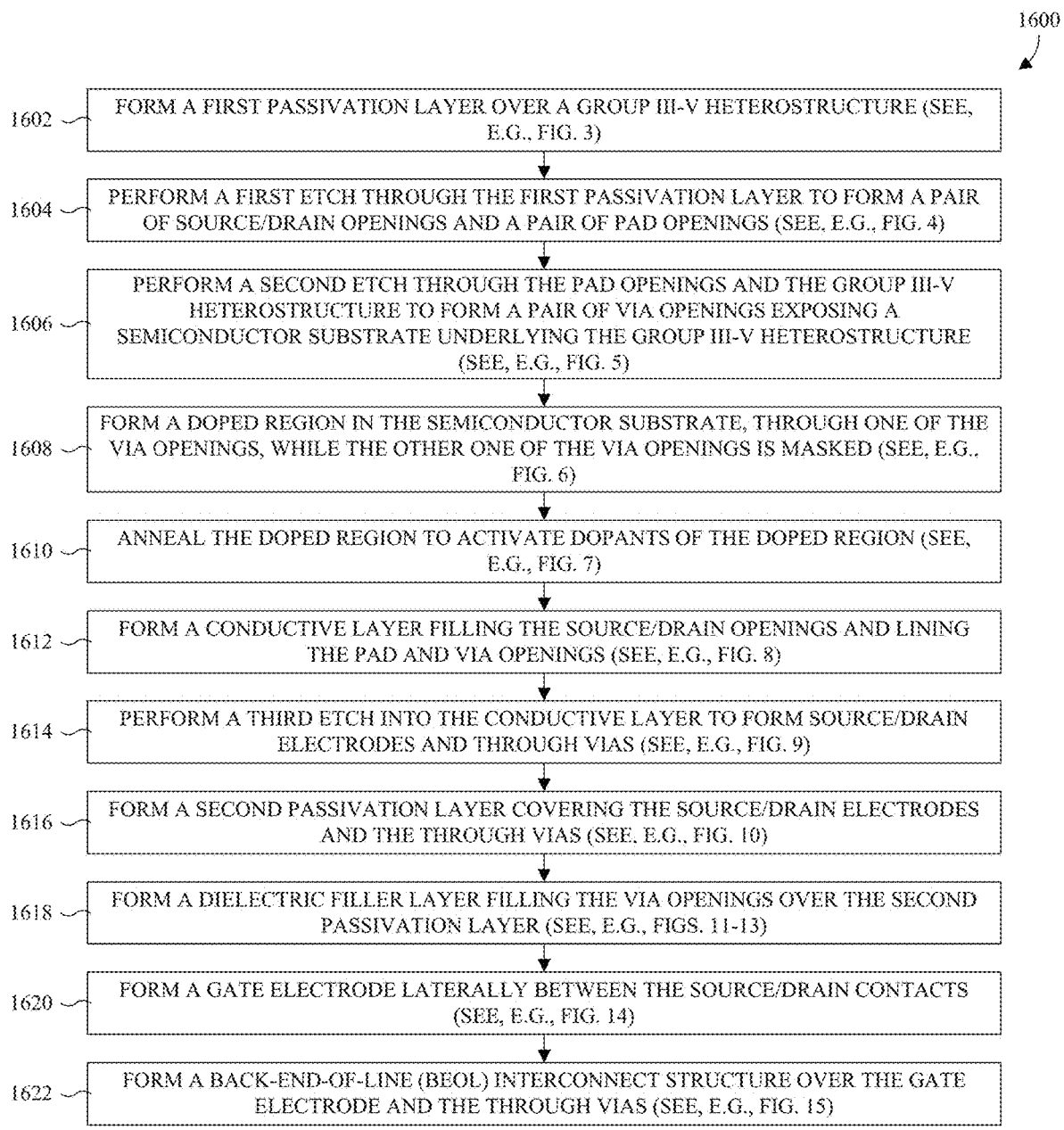
FIG. 16 illustrates a flowchart of some embodiments of the method of FIGS. 3-15.

With reference to FIG. 16, a flowchart 1600 of some embodiments of the method of FIGS. 3-15 is provided.

At 1602, a first passivation layer is formed over a group III-V heterostructure. See, for example, FIG. 3.

At 1604, a first etch is performed through the first passivation layer to form a pair of source/drain openings and a pair of pad openings. See, for example, FIG. 4.

At 1606, a second etch is performed through the pad openings and the group III-V heterostructure to form a pair of via openings exposing a semiconductor substrate underlying the group III-V heterostructure. See, for example, FIG. 5.

At 1608, a doped region is formed in the semiconductor substrate, through one of the via openings, while the other one of the via openings is masked. See, for example, FIG. 6. Advantageously, forming the doped region through the one of the via openings allows the doped region to extend into the semiconductor substrate to a depth that is sufficient to form a photodiode with low leakage.

At 1610, the doped region is annealed to activate dopants of the doped region. See, for example, FIG. 7.

At 1612, a conductive layer is formed filling the source/drain openings and lining the pad and via openings. See, for example, FIG. 8.

At 1614, a third etch is performed into the conductive layer to form source/drain electrodes and through vias. See, e.g., FIG. 9.

At 1616, a second passivation layer is formed covering the source/drain electrodes and the through vias. See, for example, FIG. 10.

At 1618, a dielectric filler layer is formed filling the via openings over the second passivation layer. See, for example, FIGS. 11-13.

At 1620, a gate electrode is formed laterally between the source/drain contacts. See, for example, FIG. 14.

At 1622, a BEOL interconnect structure over the gate electrode and the through vias. See, for example, FIG. 15.

While the method described by the flowchart 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, in some embodiments, the present disclosure provides an IC. A semiconductor substrate comprises a doped region spaced over a bottom of the semiconductor substrate. A group III-V layer is over the semiconductor substrate. A through via extends through the group III-V layer to the doped region. Further, a bottom of the through via is spaced over a bottom of the doped region.

In other embodiments, the present disclosure provides a method for manufacturing an IC. An etch is performed into a semiconductor substrate, through a group III-V layer overlying the semiconductor substrate, to form a via opening. A doped region is formed in the semiconductor substrate, through the via opening. Further, the doped region is formed with an opposite doping type as a surrounding region of the semiconductor substrate. A through via is formed in the via opening and in electrical communication with the doped region.

In yet other embodiments, the present disclosure provides another IC. A semiconductor substrate comprises a first doped region and a second doped region. The first doped region is over and laterally surrounded by the second doped region, and the first doped region is an opposite doping type as the second doped region. A group III-V heterostructure is over the semiconductor substrate. A first through via and a second through via extend through the group III-V heterostructure and terminating respectively in the first and second doped regions. Further, a bottom of the first through via is spaced over a bottom of the first doped region. A HEMT is on the group III-V heterostructure and comprises a gate electrode electrically coupled to the second through via. Further, the HEMT comprises a source/drain electrode electrically coupled to the first through via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a semiconductor substrate comprising a first doped region spaced over a bottom of the semiconductor substrate, and further comprising a second doped region having an opposite doping type as the first doped region;
   a group III-V layer over the semiconductor substrate; and
   a through via extending through the group III-V layer to the first doped region, wherein a bottom of the through via is spaced over a bottom of the first doped region;
   wherein the second doped region laterally contacts a sidewall of the first doped region to define a PN junction extending from a top surface of the semiconductor substrate to the bottom of the first doped region, wherein the PN junction extends continuously from a first location on a first side of the through via, along the bottom of the first doped region, to a second location on a second side of the through via opposite the first side, and wherein the first and second locations are on the top surface of the semiconductor substrate.

2. The IC according to claim 1, wherein the semiconductor substrate is a bulk substrate of monocrystalline silicon, and wherein the group III-V layer is gallium nitride (GaN).

3. The IC according to claim 1, wherein the first doped region laterally surrounds the through via and has a U-shaped profile.

4. The IC according to claim 1, wherein the through via overlaps the group III-V layer to define a pad.

5. The IC according to claim 1, wherein the through via conformally lines a via opening through which the through via extends to the first doped region, such that the via opening is partially filled by the through via, and wherein the IC further comprises:
   a dielectric filler layer filling the via opening over the through via.

6. The IC according to claim 1, wherein the first doped region and the second doped region define a diode, and wherein the IC further comprises:
   a second through via extending to the second doped region, through the group III-V layer, to electrically couple with the second doped region, wherein a bottom surface of the second through via is even with a bottom surface of the through via.

7. The IC according to claim 1, further comprising:
   a group III-V heterostructure over the semiconductor substrate and comprising the group III-V layer, wherein the through via extends through the group III-V heterostructure.

8. The IC according to claim 7, further comprising:
   a high-electron-mobility transistor (HEMT) on the group III-V heterostructure.

9. The IC according to claim 8, wherein the HEMT comprises:
   a gate electrode over the group III-V heterostructure;
   a pair of source/drain electrodes respectively on opposite sides of the gate electrode; and
   a passivation layer covering the source/drain electrodes and lining the through via, wherein the gate electrode extends through the passivation layer.

10. A method for manufacturing an IC, the method comprising:

performing an etch into a semiconductor substrate, through a group III-V layer overlying the semiconductor substrate, to form a via opening;

forming a doped region in the semiconductor substrate, through the via opening, wherein the doped region is formed with an opposite doping type as a surrounding region of the semiconductor substrate, and wherein the forming of the doped region comprises implanting dopants into the semiconductor substrate through a pair of opposing sidewalls of the via opening, and through a bottom of the via opening, such that the doped region is formed extending respectively from and to the opposing sidewalls and extending along the opposing sidewalls from top to bottom;

forming a through via in the via opening and in electrical communication with the doped region, wherein the through via is formed lining the via opening; and forming a dielectric structure filling the via opening over the through via.

11. The method according to claim 10, further comprising:

performing the etch into the semiconductor substrate to a first depth, wherein forming the doped region comprises implanting dopants into the semiconductor substrate to a second depth greater than the first depth.

12. The method according to claim 10, wherein the doped region is formed with a U-shaped profile.

13. The method according to claim 10, wherein the forming of the dielectric structure comprises:

forming a passivation layer lining the through via; and forming a dielectric filler layer filling the via opening over the passivation layer.

14. The method according to claim 10, further comprising:

performing the etch into the semiconductor substrate, through the group III-V layer, to form a second via opening;

forming the doped region in the semiconductor substrate, through the via opening, while the second via opening is masked; and forming a second through via in the second via opening and in electrical communication with the surrounding region of the semiconductor substrate.

15. The method according to claim 14, wherein forming the through via and the second through via comprises:

depositing a conductive layer lining the via opening and the second via opening; and performing a second etch into the conductive layer to pattern the conductive layer into the through via and the second through via.

16. The method according to claim 10, further comprising:

forming a passivation layer covering the group III-V layer;

performing a second etch through the passivation layer to form a pad opening over the group III-V layer;

performing the etch through the group III-V layer and through the pad opening, where a width of the via opening is less than that of the pad opening; and forming the through via overlapping the group III-V layer within the pad opening.

17. The method according to claim 10, further comprising:

forming a passivation layer covering the group III-V layer;

performing a second etch through the passivation layer to form a pair of source/drain openings over the group III-V layer;

forming a conductive layer filling the source/drain openings and lining the via opening; and performing a third etch into the conductive layer to form source/drain electrodes in the source/drain openings and the through via in the via opening.

18. The method according to claim 17, further comprising:

forming a second passivation layer covering the source/drain electrodes and the through via; and forming a gate electrode over the second passivation layer, laterally between the source/drain electrodes, wherein the gate electrode is formed extending through the passivation layer and the second passivation layer.

19. An integrated circuit (IC) comprising:

a semiconductor substrate comprising a first doped region and a second doped region, wherein the first doped region is over and laterally surrounded by the second doped region, and wherein the first doped region is an opposite doping type as the second doped region;

a group III-V heterostructure over the semiconductor substrate;

a first through via and a second through via extending through the group III-V heterostructure and terminating respectively in the first and second doped regions, wherein a bottom of the first through via is spaced over a bottom of the first doped region, and wherein the first or second through via overlaps the group III-V heterostructure to define a pad; and a high-electron-mobility transistor (HEMT) on the group III-V heterostructure, wherein the HEMT comprises a gate electrode electrically coupled to the second through via, and wherein the HEMT comprises a source/drain electrode electrically coupled to the first through via.

20. The IC according to claim 19, wherein the first doped region has a U-shaped profile.

* * * * *